(12) United States Patent
Hammond, IV et al.

(10) Patent No.: US 12,136,536 B2
(45) Date of Patent: Nov. 5, 2024

(54) ELECTROSTATIC CHUCK WITH MULTIPLE RADIO FREQUENCY MESHES TO CONTROL PLASMA UNIFORMITY

(71) Applicant: Applied Materials, Inc., Santa Clara, CA (US)

(72) Inventors: Edward P. Hammond, IV, Hillsborough, CA (US); Jonghoon Baek, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1018 days.

(21) Appl. No.: 16/970,110

(22) PCT Filed: Feb. 28, 2019

(86) PCT No.: PCT/US2019/020001
§ 371 (c)(1),
(2) Date: Aug. 14, 2020

(87) PCT Pub. No.: WO2019/169102
PCT Pub. Date: Sep. 6, 2019

(65) Prior Publication Data
US 2021/0166915 A1    Jun. 3, 2021

Related U.S. Application Data

(60) Provisional application No. 62/636,437, filed on Feb. 28, 2018.

(51) Int. Cl.
*H01J 37/32* (2006.01)
*C23C 16/458* (2006.01)
(Continued)

(52) U.S. Cl.
CPC .... *H01J 37/32174* (2013.01); *C23C 16/4587* (2013.01); *C23C 16/509* (2013.01);
(Continued)

(58) Field of Classification Search
CPC .......... H01J 37/32165; H01J 37/32174; H01J 37/32715; H01J 37/32568;
(Continued)

(56) References Cited

U.S. PATENT DOCUMENTS

2002/0159216 A1   10/2002   Ennis
2008/0236492 A1   10/2008   Yamazawa
(Continued)

FOREIGN PATENT DOCUMENTS

CN    103069550 A    4/2013
JP    2008-244063 A   10/2008
(Continued)

OTHER PUBLICATIONS

Japan Office Action dated Mar. 7, 2023, for JP Application No. 2020-544409.

(Continued)

*Primary Examiner* — Yuechuan Yu
(74) *Attorney, Agent, or Firm* — Patterson + Sheridan, LLP

(57) ABSTRACT

The present disclosure relates to a method and apparatus for controlling a plasma sheath near a substrate edge. Changing the voltage/current distribution across the inner electrode and the outer electrode with in the substrate assembly facilitates the spatial distribution of the plasma across the substrate. The method includes providing a first radio frequency power to a central electrode embedded in a substrate support assembly, providing a second radio frequency power to an annular electrode embedded in the substrate support assembly at a location different than the central electrode, wherein the annular electrode circumferentially surrounds the central electrode, monitoring parameters of the first and
(Continued)

second radio frequency power, and adjusting one or both of the first and second radio frequency power based on the monitored parameters.

24 Claims, 7 Drawing Sheets

(51) Int. Cl.
  C23C 16/509 (2006.01)
  H01L 21/683 (2006.01)
  H01L 21/67 (2006.01)
(52) U.S. Cl.
  CPC .. *H01J 37/32568* (2013.01); *H01J 37/32715* (2013.01); *H01L 21/6833* (2013.01); *H01J 2237/2007* (2013.01); *H01J 2237/3321* (2013.01); *H01J 2237/334* (2013.01); *H01L 21/67069* (2013.01)
(58) Field of Classification Search
  CPC ....... H01J 2237/3321; H01J 2237/2007; H01J 2237/334; C23C 16/509; C23C 16/4587; H01L 21/6833; H01L 21/6831; H01L 21/67069
  See application file for complete search history.

(56) References Cited

U.S. PATENT DOCUMENTS

| | | |
|---|---|---|
| 2009/0071938 A1 | 3/2009 | Dhindsa et al. |
| 2009/0101283 A1 | 4/2009 | Iwata |
| 2011/0253672 A1* | 10/2011 | Kamibayashi .... H01J 37/32091 216/61 |
| 2012/0164834 A1* | 6/2012 | Jennings ........... H01L 21/68792 118/723 R |
| 2014/0139049 A1 | 5/2014 | Fischer et al. |
| 2014/0231019 A1 | 8/2014 | Kajihara |

FOREIGN PATENT DOCUMENTS

| | | | |
|---|---|---|---|
| JP | 2010-532099 A | 9/2010 | |
| JP | 2011119654 A * | 6/2011 | ................ B23Q 3/15 |
| JP | 2011-228436 A | 11/2011 | |
| JP | 2014-505362 A | 2/2014 | |
| KR | 20140051806 A | 5/2014 | |
| KR | 20180019255 A | 2/2018 | |
| WO | 2014/073554 A1 | 5/2014 | |

OTHER PUBLICATIONS

International Search Report and Written Opinion for Application No. PCT/US2019/020001 dated Jun. 9, 2019.
Korean Office Action dated Jan. 17, 2024 for Application No. 10-2020-7027518.
Chinese Office Action dated Dec. 19, 2023 for Application No. 201980017976.0.
Chinese Office Action dated May 10, 2024 for Application No. 201980017976.0.
Chinese Notice on Grant and Search Report dated Aug. 21, 2024 for Application No. 201980017976.0.

* cited by examiner

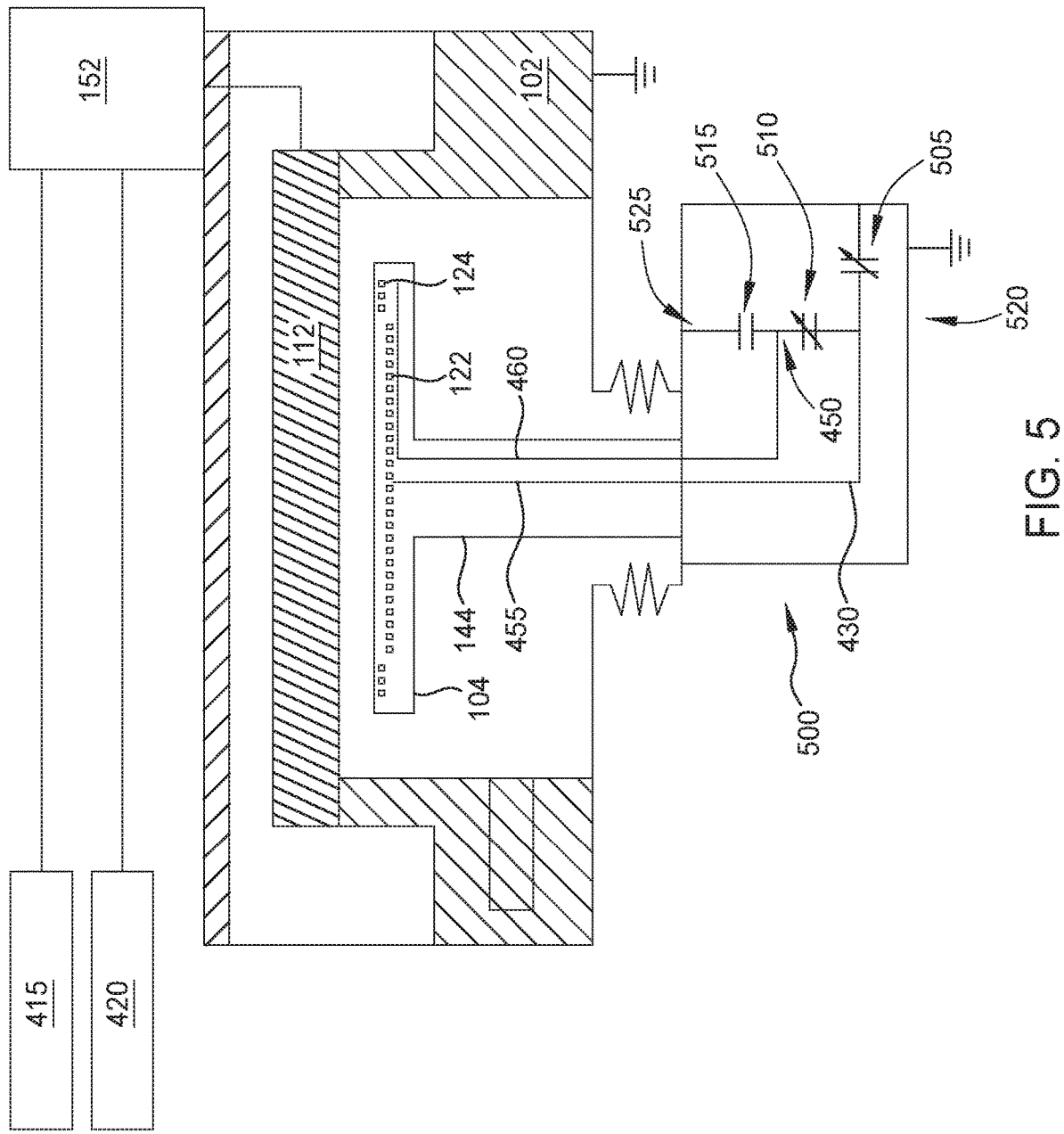

ELECTROSTATIC CHUCK WITH MULTIPLE RADIO FREQUENCY MESHES TO CONTROL PLASMA UNIFORMITY

CROSS-REFERENCE TO RELATED APPLICATIONS

This application is a National Stage Entry of international patent application number PCT/US2019/020001, filed Feb. 28, 2019, which claims priority to U.S. provisional patent application Ser. No. 62/636,437, filed Feb. 28, 2018, both of which are herein incorporated by reference in their entireties.

BACKGROUND

Field

Embodiments disclosed herein generally relate to apparatus and methods for tuning a plasma in a semiconductor substrate manufacturing process, more specifically, apparatus and methods for tuning a plasma near an edge of a semiconductor substrate.

Description of the Related Art

In the manufacture of integrated circuits and other electronic devices, plasma processes are often used for deposition or etching of various material layers. Plasma-enhanced chemical vapor deposition (PECVD) process is a chemical process wherein electro-magnetic energy is applied to at least one precursor gas or precursor vapor to transform the precursor into a reactive plasma. Plasma may be generated inside the processing chamber, i.e., in-situ, or in a remote plasma generator that is remotely positioned from the processing chamber. This process is widely used to deposit materials on substrates to produce high-quality and high-performance semiconductor devices.

In the current semiconductor manufacturing industry, transistor structures have become increasingly complicated and challenging as feature size continues to decrease. To meet processing demands, advanced processing control techniques are useful to control cost and maximize substrate and die yield. Normally, the dies at the edge of the substrate suffer yield issues such as contact via misalignment, and poor selectivity to a hard mask. On the substrate processing level, there is a need for advancements in process uniformity control to allow fine, localized process tuning as well as global processing tuning across the whole substrate.

Therefore, there is a need for methods and apparatus to allow fine, localized process tuning at the edge of the substrate.

SUMMARY

Embodiments disclosed herein generally relate to an apparatus and method for plasma tuning near a substrate edge. In one implementation, a method for tuning a plasma in a chamber is disclosed. The method includes providing a first radio frequency power to a central electrode embedded in a substrate support assembly, providing a second radio frequency power to an annular electrode embedded in the substrate support assembly at a location different than the central electrode, wherein the annular electrode is spaced from the central electrode and circumferentially surrounds the central electrode, monitoring parameters of the first and second radio frequency power, and adjusting one or both of the first and second radio frequency power based on the monitored parameters.

In another embodiment, a semiconductor processing chamber is disclosed. The semiconductor processing chamber includes a pedestal disposed in the chamber having a first electrode and a second electrode circumferentially surrounding the first electrode, a high frequency power source and a low frequency power source coupled to both of the first electrode and the second electrode, a power splitter disposed between the high frequency power source and the low frequency power source, and the first electrode and the second electrode, and an electrode tuning circuit coupled to both of the first electrode and the second electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5 is a schematic diagram of another embodiment of a power filter that may be utilized with the processing chamber of FIG. 1.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to methods and apparatus for controlling a plasma sheath near a substrate edge. The disclosure provides radio frequency (RF) circuits and methods to adjust the distribution of RF power to more than one mesh embedded in a substrate support or pedestal that also functions as an electrostatic chuck. The methods and apparatus described herein apply whether the embedded meshes are a source of RF power (e.g., a powered electrode or powered electrodes), or whether the meshes are the destination for RF power (e.g., a ground electrode or ground electrodes). Embodiments disclosed herein allow the modulation of the plasma profile uniformity above a substrate. Changing the plasma distribution leads to improved uniformity of film parameters on the substrate, for example, deposition rate, film stress, refractive index, as well as other parameters.

Conventional plasma control techniques to modulate plasma include top and bottom tuners which only weakly modify the plasma properties at the edge of a substrate relative to the rest of the substrate. This disclosure provides tuning elements to affect the plasma profile at the substrate edge as well as affecting other regions of the substrate other than the edge. Previous approaches to modulate the plasma at the edge of a substrate involved different process kits or edge rings. However, these are generally process specific, and when more than one film is deposited (for example, silicon oxide and silicon nitride) in the same chamber, it can be difficult to optimize the uniformity for both processes using the same set of hardware. The present disclosure provides the ability to change the plasma profile without changing hardware.

The present disclosure provides a pedestal having a plurality of meshes embedded therein, and one of the meshes functions as a chucking electrode to chuck a substrate thereon. A voltage divider is utilized to control and/or adjust the RF power to different meshes, or the RF power to different mesh segments. The voltage division is done with a capacitive voltage divider, a series resonance divider, or a parallel resonance divider. The variable element in the circuit is a capacitor, but the resonance based dividers can use fixed circuit elements and employ a variable frequency generator to modulate the power division. The different legs following the divider may require additional filtering elements either to block one frequency and pass another, or to compensate for subsequent circuit elements intrinsic to the pedestal configuration. The power division hardware applies whether the embedded meshes are a source of RF power (e.g., an electrode or electrodes), or whether the meshes are the destination for RF power (e.g., ground).

Figure 1:
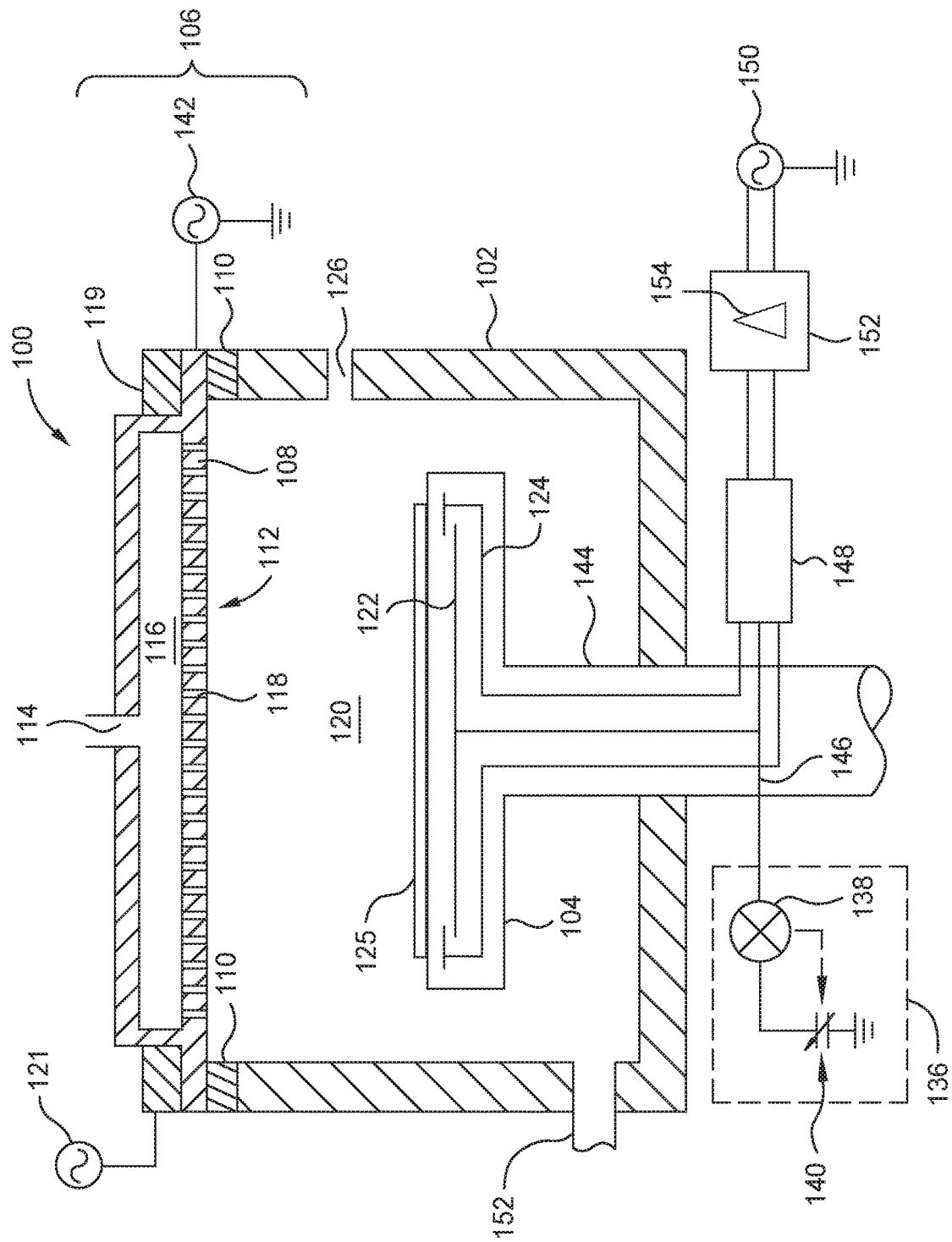
FIG. 1 illustrates a cross sectional view of a processing chamber, according to one aspect of the disclosure.

FIG. 1 is a cross sectional view of a processing chamber 100, according to one aspect of the disclosure. As shown, the processing chamber 100 is an etch chamber suitable for etching a substrate, such as substrate 125. Examples of processing chambers that may be adapted to benefit from exemplary aspects of the disclosure are Producer® Etch Processing Chamber, and Precision™ Processing Chamber, commercially available from Applied Materials, Inc., located in Santa Clara, California. It is contemplated that other processing chambers, including those from other manufacturers, may be adapted to benefit from aspects of the disclosure.

The processing chamber 100 may be used for various plasma processes. In one aspect, the processing chamber 100 may be used to perform dry etching with one or more etching agents. For example, the processing chamber may be used for ignition of plasma from a precursor $C_xF_y$ (where x and y represent known compounds), $O_2$, $NF_3$, or combinations thereof. In another implementation the processing chamber 100 may be used for plasma enhanced chemical vapor deposition (PECVD) with one or more precursors.

The processing chamber 100 includes a chamber body 102, a lid assembly 106, and a pedestal 104. The lid assembly 106 is positioned at an upper end of the chamber body 102. The pedestal 104 is disposed inside the chamber body 102, and the lid assembly 106 coupled to the chamber body 102 and enclosing the pedestal 104 in a processing volume 120. The chamber body 102 includes a transfer port 126, which may include a slit valve, formed in a sidewall thereof. The transfer port 126 is selectively opened and closed to allow access to the processing volume 120 by a substrate handling robot (not shown) for substrate transfer.

An electrode 108 is provided as a portion of the lid assembly 106. The electrode 108 may also function as a gas distributor plate 112 having a plurality of openings 118 for admitting process gas into the processing volume 120. The process gases may be supplied to the processing chamber 100 via a conduit 114, and the process gases may enter a gas mixing region 116 prior to flowing through the openings 118. The electrode 108 is coupled to a source of electric power 142, such as an RF generator. DC power, pulsed DC power, and pulsed RF power may also be used. An isolator 110, which may be a dielectric material such as a ceramic or metal oxide, for example aluminum oxide and/or aluminum nitride, contacts the electrode 108 and separates the electrode 108 electrically and thermally from the chamber body 102. A heater 119 is shown coupled to the gas distributor plate 112. The heater 119 is coupled to an AC power source 121.

The pedestal 104 is coupled to a lift mechanism through a shaft 144, which extends through a bottom surface of the chamber body 102. The lift mechanism may be flexibly sealed to the chamber body 102 by a bellows that prevents vacuum leakage from around the shaft 144. The lift mechanism allows the substrate support 180 to be moved vertically within the chamber body 102 between a transfer position and a number of process positions to place the substrate 125 in proximity to the electrode 108.

The pedestal 104 may be formed from a metallic or ceramic material, for example a metal oxide or nitride or oxide/nitride mixture such as aluminum, aluminum oxide, aluminum nitride, or an aluminum oxide/nitride mixture. A first pedestal electrode 122 and a second pedestal electrode 124 are provided in the pedestal 104. The first pedestal electrode 122 and the second pedestal electrode 124 may be embedded within the pedestal 104 or coupled to a surface of the pedestal 104. The first pedestal electrode 122 and the second pedestal electrode 124 may be a plate, a perforated plate, a mesh, a wire screen, or any other distributed arrangement. One or both of the first pedestal electrode 122 and the second pedestal electrode 124 may be a tuning electrode, and may be coupled to a tuning circuit 136 by a conduit 146, for example a cable having a selected resistance such as 50Ω, disposed in a shaft 144 of the pedestal 104. The tuning circuit 136 may have a sensor 138 and an electronic controller 140, which may be a variable capacitor. The sensor 138 may be a voltage or current sensor, and may be coupled to the electronic controller 140 to provide further control over plasma conditions in the processing volume 120. The first pedestal electrode 122 may also be a chucking electrode.

The first pedestal electrode 122 and the second pedestal electrode 124 are coupled to a power source 150. The power source 150 may illustratively be a source of up to about 1000 W (but not limited to about 1000 W) of RF energy at a frequency of, for example, approximately 13.56 MHz, although other frequencies and powers may be provided as desired for particular applications. The power source 150 may be capable of producing AC power in multiple frequencies, such as 13.56 MHz and 2 MHz. The power source 150 may also produce either or both of continuous or pulsed DC power that may be utilized to chuck the substrate 125. A mesh tuner 148 is shown coupled between the power source 150 and the first pedestal electrode 122 and the second pedestal electrode 124.

Figure 2:
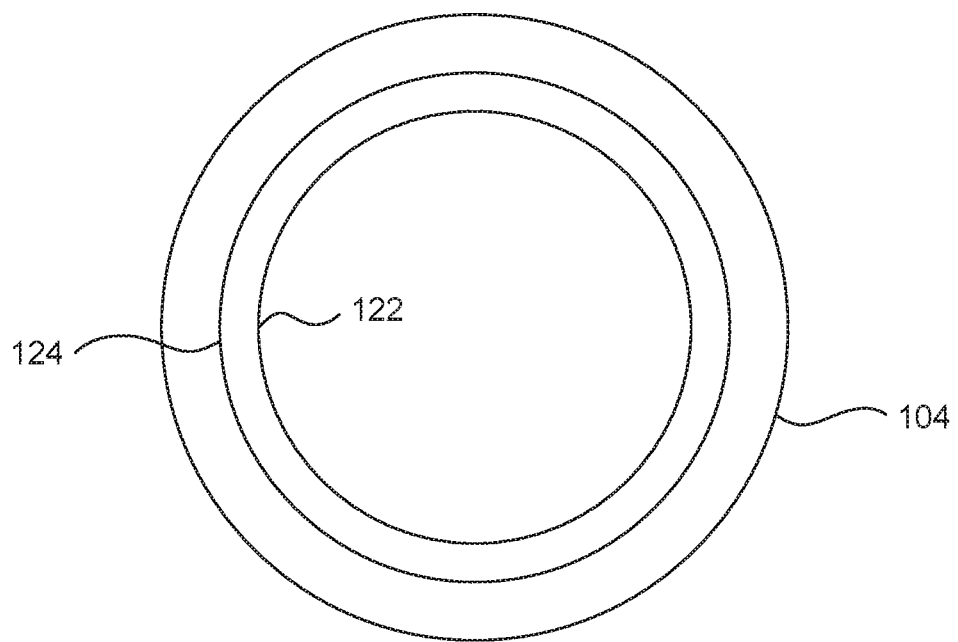
FIG. 2 illustrates a top view of a substrate assembly, according to one aspect of the disclosure.

An RF match 152 is coupled to each of the first pedestal electrode 122 and the second pedestal electrode 124 and the power source 150. The RF match 152 includes a power splitter 154. One or both of the RF match 152 and the mesh tuner 148 comprises a power filter (described below) for controlling power to the first pedestal electrode 122 and the second pedestal electrode 124, FIG. 2 illustrates a top view of a pedestal 104, according to one aspect of the disclosure. The pedestal 104 includes a plurality of electrodes. The first pedestal electrode 122 and the second pedestal electrode 124 are a mesh, or a wire screen. The first pedestal electrode 122 and the second pedestal electrode 124 may be formed from aluminum or copper, or other electrically conductive metals or materials.

In one implementation, the second pedestal electrode 124 has a greater surface area than the first pedestal electrode 122. In one implementation, the second pedestal electrode 124 has a greater diameter than the first pedestal electrode 122. The second pedestal electrode 124 may surround the first pedestal electrode 122. In one implementation, the first pedestal electrode 122 may function as a chucking electrode while also functioning as a first RF electrode. The second pedestal electrode 124 may be a second RF electrode that together with the first pedestal electrode 122 tunes the plasma. The first pedestal electrode 122 and the second pedestal electrode 124 may apply power at the same frequency or at different frequencies. The RF power to one or both of the first pedestal electrode 122 and the second pedestal electrode 124 may be varied in order to tune the plasma. For example, a sensor (not shown) may be used to monitor the RF energy from one or both of the first pedestal electrode 122 and the second pedestal electrode 124. Data from the sensor device may be communicated and utilized to vary power applied to the RF power source for the first pedestal electrode 122 and/or the RF power source for the second pedestal electrode 124.

Figure 3:
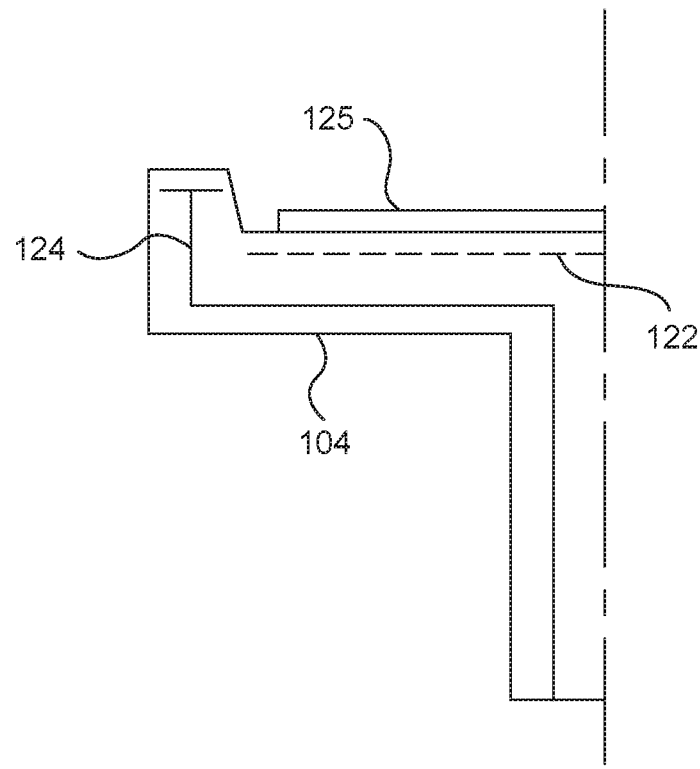
FIG. 3 illustrates a partial perspective view of a substrate assembly, according to one aspect of this disclosure.

FIG. 3 illustrates a partial perspective view of a pedestal 104, according to one aspect of this disclosure. In this implementation, the second pedestal electrode 124 is disposed laterally adjacent the substrate 125 within the pedestal 104. The second pedestal electrode 124 is disposed above the first pedestal electrode 122, closer to the substrate 125.

Figure 4:
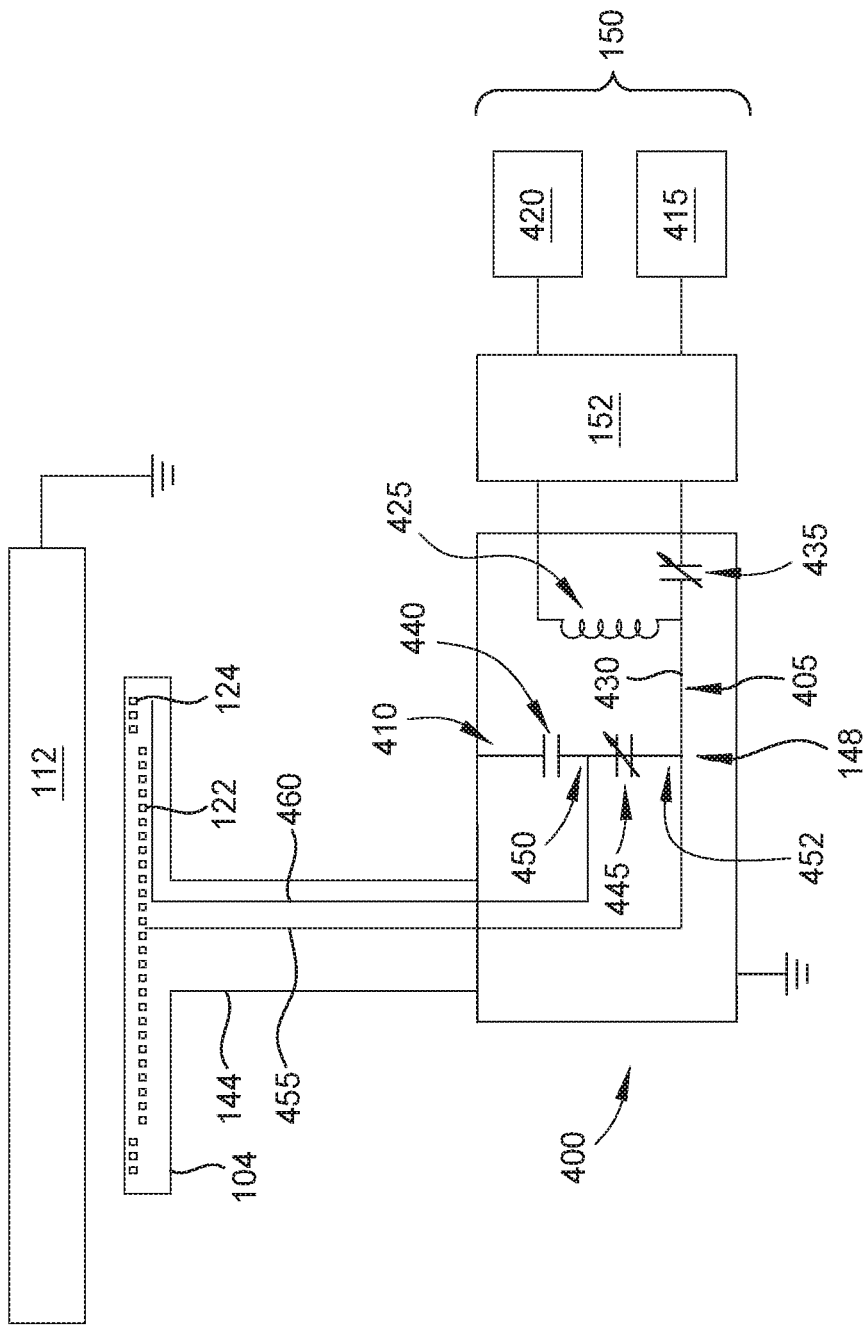
FIG. 4 is a schematic diagram of one embodiment of a power filter that may be utilized with the processing chamber of FIG. 1.

FIG. 4 is a schematic diagram of one embodiment of a power filter 400 that may be utilized with the processing chamber 100 of FIG. 1. In this embodiment, RF power for the processing chamber is provided from the bottom. For example, the gas distributor plate 112 is grounded and RF power for plasma formation is provided by the first pedestal electrode 122 and the second pedestal electrode 124.

The power filter 400 includes the mesh tuner 148, which may function as a power splitter. The power filter 400 includes a first circuit 405 and a second circuit 410. Both of the first circuit 405 and the second circuit 410 are positioned between the power source 150 and the first pedestal electrode 122 and the second pedestal electrode 124. In this embodiment, the power source 150 includes a high frequency RF generator 415 and a low frequency generator 420.

The first circuit 405 includes an inductor 425 coupled between the low frequency generator 420 and a filter main lead 430. The filter main lead 430 is coupled to both of the high frequency RF generator 415 and the low frequency generator 420, and each of the first pedestal electrode 122 and the second pedestal electrode 124. The filter main lead 430 is also coupled to the high frequency RF generator 415 and a first capacitor 435 is positioned therebetween The high frequency RF generator 415 is coupled to the filter main lead 430 and the second circuit 410. The low frequency generator 420 and the first circuit 405 are coupled to the filter main lead 430 by the inductor 425.

The second circuit 410 includes a second capacitor 440 and a third capacitor 445. The third capacitor 445 is a variable capacitor. The third capacitor 445 functions as a tuning knob. The first circuit 405 and the second circuit 410 are coupled to the first pedestal electrode 122 by the filter main lead 430. The first circuit 405 and the second circuit 410 are coupled to the second pedestal electrode 124 at a node 450. The second circuit 410 is also coupled to the filter main lead 430 at a node 452. The filter main lead 430 is coupled to the first pedestal electrode 122 by a rod 455. The second pedestal electrode 124 is coupled to the power filter 400 by a rod 460. Both of the rod 455 and the rod 460 are positioned in the shaft 144, FIG. 5 is a schematic diagram of another embodiment of a power filter 500 that may be utilized with the processing chamber 100 of FIG. 1. In this embodiment, RF power for the processing chamber is provided from the top. For example, the gas distributor plate 112 is coupled to the high frequency RF generator 415 and the low frequency generator 420 by the RF match 152. In this embodiment, the power filter 500 is utilized to vary the ground path for both of the first pedestal electrode 122 and the second pedestal electrode 124. The power filter 500 may be used to vary plasma properties of the first pedestal electrode 122 and the second pedestal electrode 124 by varying the ground path thereto, while the gas distributor plate 112 may be electrically floating.

The power filter 500 according to this embodiment includes a first capacitor 505, a second capacitor 510, and a third capacitor 515. The first capacitor 505 and the second capacitor 510 are variable capacitors while the third capacitor 515 is a fixed capacitor. The first capacitor 505 and the second capacitor 510 may be utilized as tuning knobs that vary the path to ground for one of both of the first pedestal electrode 122 and the second pedestal electrode 124.

The power filter 500 includes a first circuit 520 comprising the first capacitor 505 and the filter main lead 430. The filter main lead 430 is coupled to the first pedestal electrode 122 by the rod 455. The first capacitor 505 is coupled to ground. The power filter 500 also includes a second circuit 525 which includes the second capacitor 510 and the third capacitor 515. The second circuit 525 is coupled to the second pedestal electrode 124 by the node 450 and the rod 460, The second circuit 525 is also coupled to the filter main lead 430 at the node 452.

FIGS. 6A-6D are schematic diagrams showing various embodiments of tuning circuits for tuning the first pedestal electrode 122 and the second pedestal electrode 124. A portion of the power filter 400 of FIG. 4 is shown in FIGS. 6A-6D.

Figure 6A:
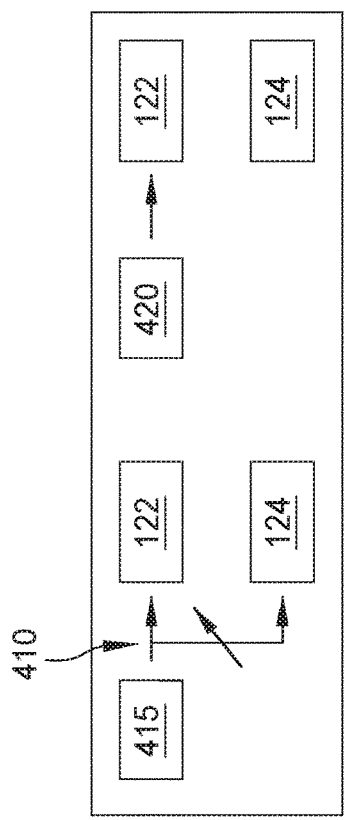
FIGS. 6A-6D are schematic diagrams showing various embodiments of tuning circuits for tuning the first pedestal electrode and the second pedestal electrode.

In FIG. 6A, signals from the high frequency RF generator 415 and the low frequency generator 420 are separated and then combined independently. In FIG. 6B, signals from the high frequency RF generator 415 and the low frequency generator 420 are separated and then combined dependently.

Figure 6C:
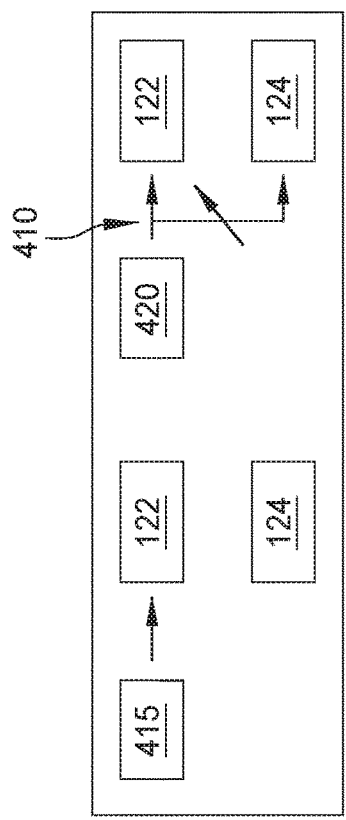
Figure 6B:
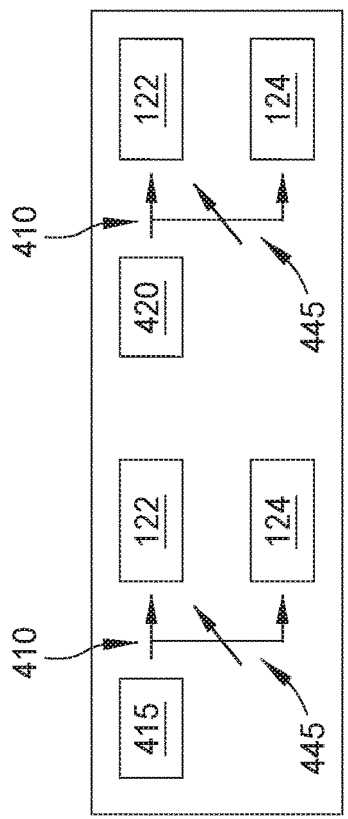
Figure 6D:
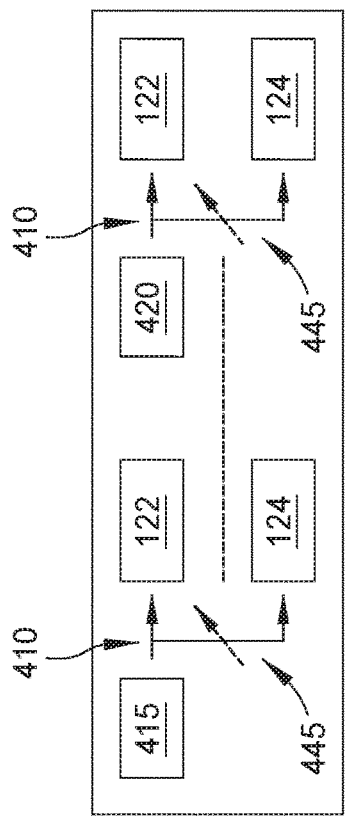

FIGS. 6C and 6D show application of signals from the high frequency RF generator 415 and the low frequency generator 420 that are split and then provided to each of the first pedestal electrode 122 and the second pedestal electrode 124 as desired.

In FIG. 6C, high frequency signals are provided to the first pedestal electrode 122 and the second pedestal electrode 124 while low frequency signals are only provided to the first pedestal electrode 122. Thus, the low frequency signals are not provided to the second pedestal electrode 124 in FIG. 6C.

In FIG. 6D, low frequency signals are provided to the first pedestal electrode 122 and the second pedestal electrode 124 while high frequency signals are only provided to the first pedestal electrode 122. Thus, the high frequency signals are not provided to the second pedestal electrode 124 in FIG. 6D.

Figure 7:
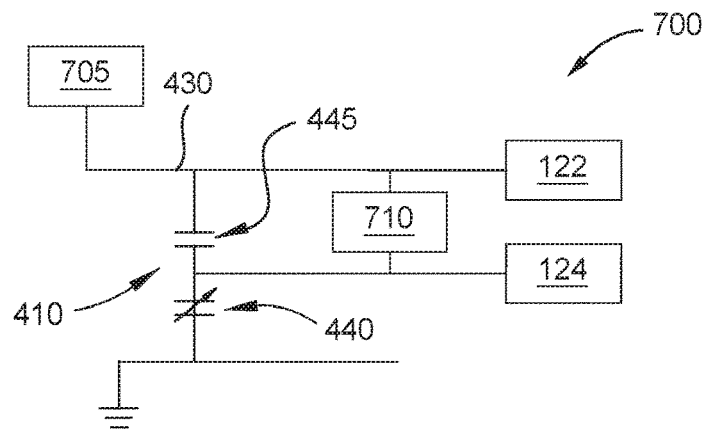
FIG. 7 and FIGS. 8A-8C are schematic diagrams depicting various power splitting circuits that may be used with the power filters as described herein.
Figure 8A:
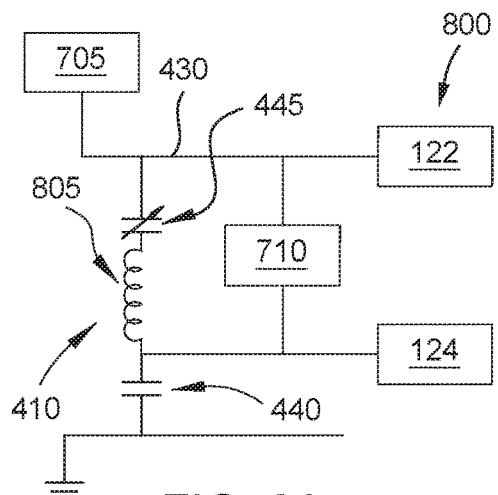

FIG. 7 and FIGS. 8A-8O are schematic diagrams depicting various power splitting circuits that may be used with the power filter 400 or the power filter 500, as well as the power splitter 154, as described above, FIG. 7 depicts a capacitive voltage divider 700. The capacitive voltage divider 700 of FIG. 7 receives a power input signal 705 that is RF power at a fixed frequency. The third capacitor 445 provides a low impedance, and may be adjusted to provide the same voltage to the first pedestal electrode 122 and the second pedestal electrode 124. A sensor 710 is coupled to both of the first pedestal electrode 122 and the second pedestal electrode 124. The sensor 710 monitors power (e.g., voltage, current and/or phase) to each of the first pedestal electrode 122 and the second pedestal electrode 124. Tuning of the first pedestal electrode 122 and the second pedestal electrode 124 is adjusted based on the information from the sensor 710.

FIG. 8A depicts a voltage divider circuit 800 that comprises the second capacitor 440 and the third capacitor 445 connected in series. An inductor 805 is positioned between the second capacitor 440 and the third capacitor 445. The third capacitor 445 may be adjusted to vary voltage between the first pedestal electrode 122 and the second pedestal electrode 124. The voltage divider circuit 800 comprises a series resonance circuit in one embodiment.

Figure 8B:
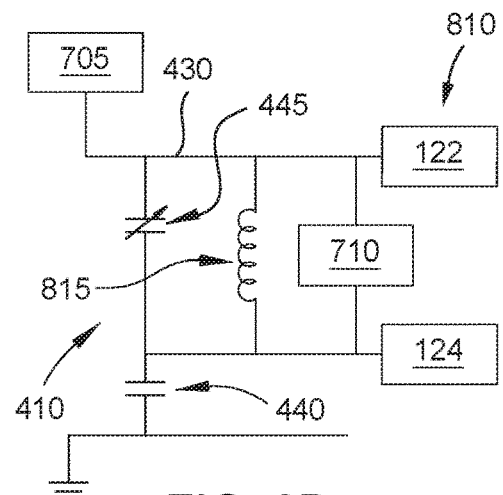

FIG. 8B depicts a voltage divider circuit 810 that comprises the second capacitor 440 and the third capacitor 445. An inductor 815 is connected in parallel to the second capacitor 440 and the third capacitor 445. The third capacitor 445 may be adjusted to vary voltage between the first pedestal electrode 122 and the second pedestal electrode 124. The voltage divider circuit 800 comprises a parallel resonance circuit in one embodiment. The inductor 815 may provide a higher impedance.

Figure 8C:
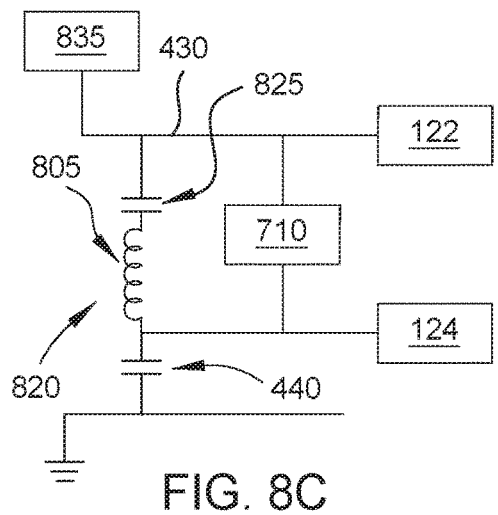

FIG. 8C depicts a voltage divider circuit 820 that comprises the second capacitor 440 (a first fixed capacitor) and a fourth capacitor 825 (a second fixed capacitor) connected in series. The inductor 805 is positioned between the second capacitor 440 and the fourth capacitor 825.

Figure 8D:
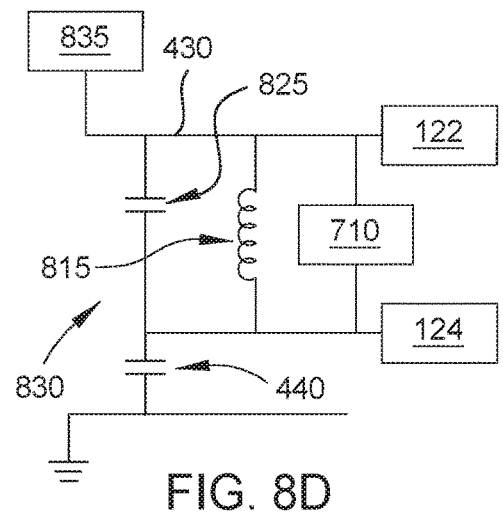

FIG. 8D depicts a voltage divider circuit 830 that comprises the second capacitor 440 (a first fixed capacitor) and a fourth capacitor 825 (a second fixed capacitor) connected in parallel. The inductor 815 is positioned between the second capacitor 440 and the fourth capacitor 825.

In FIGS. 8C and 8D, the circuits are coupled to a power input signal 835 that provides RF power in various frequencies. Each of the voltage divider circuit 820 and the voltage divider circuit 830 contain no variable capacitor, and are utilized to adjust RF frequencies to the respective circuits to tune the first pedestal electrode 122 and the second pedestal electrode 124.

Figure 9:
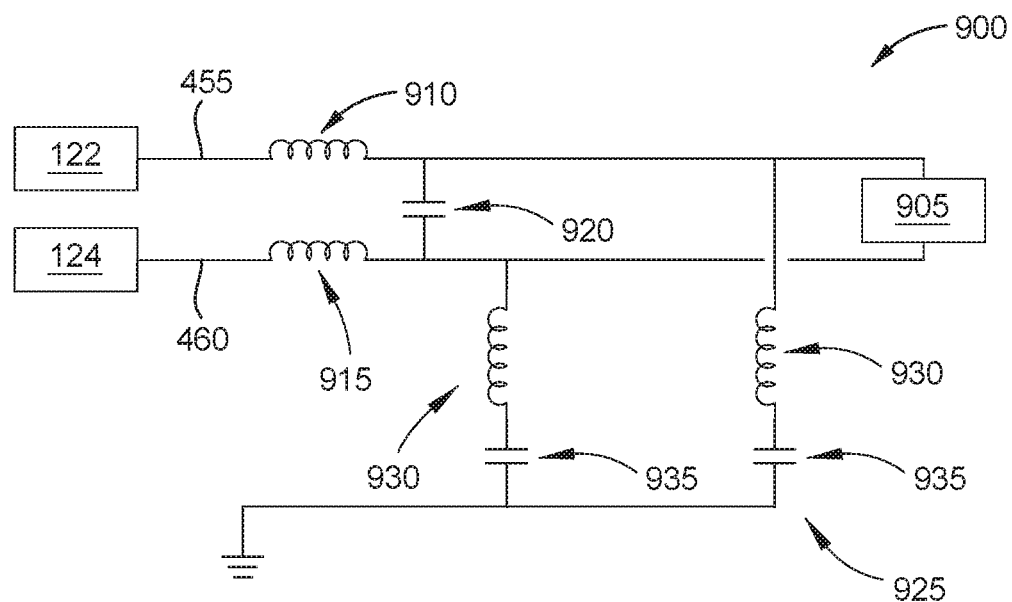
FIG. 9 is a schematic diagram depicting a circuit configured to counter inductance by the rods in the stem of the pedestal.

FIG. 9 is a schematic diagram depicting a circuit 900 configured to counter inductance by the rods 455 and 460. The circuit 900 is provided between a voltage divider (e.g., the power dividing circuits described above) and the first pedestal electrode 122 and the second pedestal electrode 124. The circuit 900 includes an inductor 910 and an inductor 915 coupled to the rod 455 and the rod 460, respectively. The circuit 900 also includes an intermesh capacitor 920 coupled to each of the inductors. The circuit 900 also includes a pair of LC circuits 925, each consisting of an inductor 930 and a fixed capacitor 935. The LC circuits 925 allow low frequency power to pass with low impedance but provide capacitance to cancel inductance from one or both of the rods 455 and 460. The circuit 900 may use one of the capacitors to cancel inductance of the rods 455 and 460 for high frequency power and block low frequency power. The inductors may be utilized to block high frequency power and pass low frequency power.

Figure 10:
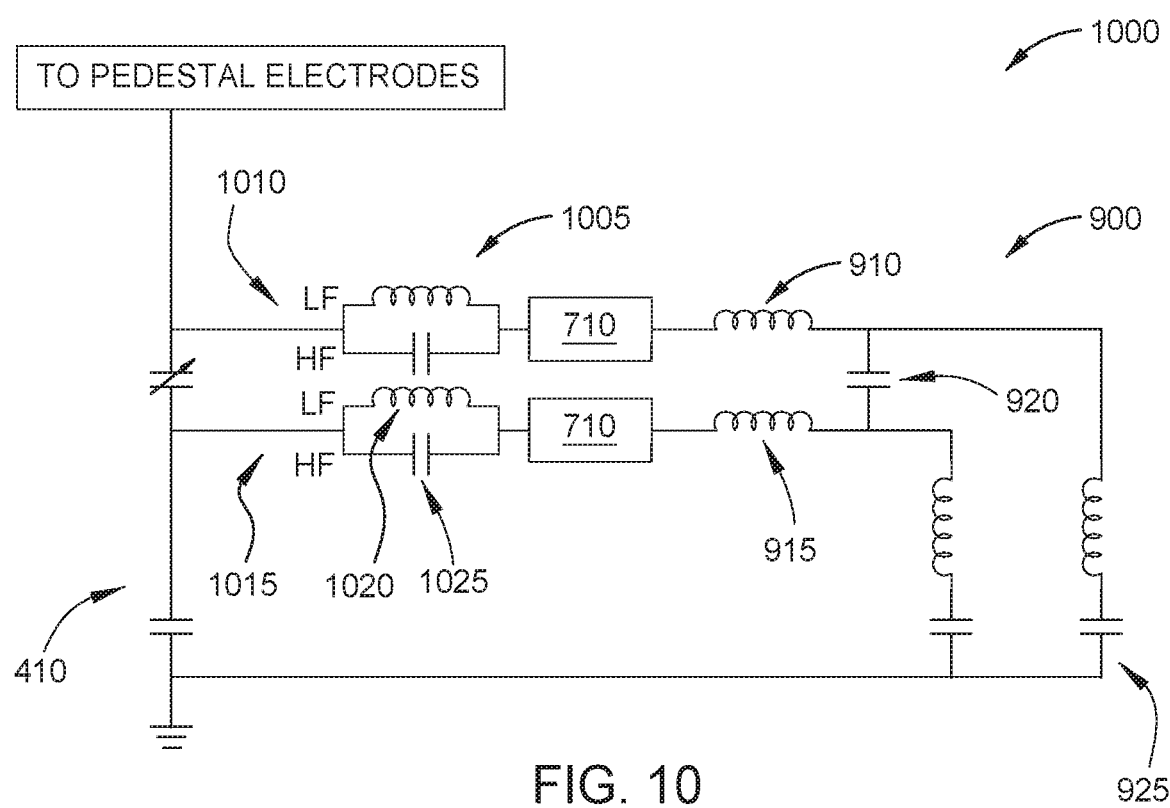
FIG. 10 is a schematic diagram depicting a power divider circuit according to another embodiment.

FIG. 10 is a schematic diagram depicting a power divider circuit 1000 according to another embodiment. The power divider circuit 1000 includes the circuit 900 and the second circuit 410. The power divider circuit 1000 also includes a filter circuit 1005. Each of the filter circuits 1005 include an inductor 1020 (utilized to pass low frequency power with low inductive impedance) and a capacitor 1025 (to pass high frequency power with a capacitance that cancels out inductance of the rods 455 and 460 (not shown)). Each of the filter circuits 1005 are configured as parallel LC circuits.

Benefits of the present disclosure include increased control of plasma adjacent edges of a substrate. Increasing the plasma control results in increased plasma uniformity.

While the foregoing is directed to embodiments of the present disclosure, other and further embodiments of the disclosure may be devised without departing from the basic scope thereof, and the scope thereof is determined by the claims that follow.

The invention claimed is:

1. A semiconductor processing chamber, comprising:
    a pedestal disposed in the semiconductor processing chamber, the pedestal having a first electrode and a second electrode circumferentially surrounding the first electrode;
    a high frequency power source and a low frequency power source coupled to both of the first electrode and the second electrode;
    a power splitter disposed between the high frequency power source and the low frequency power source, and the first electrode and the second electrode; and
    an electrode tuning circuit coupled to both of the first electrode and the second electrode, the electrode tuning circuit comprising:
        a plurality of capacitors, one of the plurality of capacitors directly coupled to the high frequency power source through the power splitter, and
        an inductor directly coupled to the low frequency power source through the power splitter.

2. The semiconductor processing chamber of claim 1, wherein at least one of the plurality of capacitors comprises a variable capacitor.

3. The semiconductor processing chamber of claim 1, wherein a sensor is coupled to each of the first electrode and the second electrode.

4. The semiconductor processing chamber of claim 1, wherein the electrode tuning circuit comprises a plurality of parallel LC circuits.

5. The semiconductor processing chamber of claim 1, wherein the second electrode partially overlaps the first electrode.

6. The semiconductor processing chamber of claim 1, wherein the first electrode is disposed below the second electrode.

7. The semiconductor processing chamber of claim 6, wherein the second electrode partially overlaps the first electrode.

8. The semiconductor processing chamber of claim 1, further comprising a gas distributor plate, wherein the gas distributor plate is configured to be electrically grounded.

9. A substrate support assembly for positioning in a semiconductor processing chamber, comprising:
 a substrate support, the substrate support having a first electrode and a second electrode, at least part of the second electrode disposed outwardly of the first electrode;
 a power splitter; and
 an electrode tuning circuit coupled to both of the first electrode and the second electrode, the electrode tuning circuit disposed between the power splitter and the first and second electrodes, the electrode tuning circuit comprising:
  a first capacitor coupled to a first node coupled to the first electrode,
  an inductor coupled to the first node,
  a second capacitor between ground and a second node coupled to the second electrode, and
  a third capacitor between the first node and the second node.

10. The substrate support assembly of claim 9, wherein the first capacitor and the third capacitor are variable capacitors, and the second capacitor is a fixed capacitor.

11. The substrate support assembly of claim 9, wherein the second electrode circumferentially surrounds the first electrode.

12. The substrate support assembly of claim 9, wherein the first electrode is disposed below the second electrode.

13. The substrate support assembly of claim 9, wherein the second electrode partially overlaps the first electrode.

14. The substrate support assembly of claim 9, wherein the electrode tuning circuit comprises a plurality of parallel LC circuits.

15. A substrate support assembly for positioning in a semiconductor processing chamber, comprising:
 a substrate support, the substrate support having a first electrode and a second electrode, at least part of the second electrode disposed outwardly of the first electrode; and
 an electrode tuning circuit coupled to the first electrode and the second electrode, the electrode tuning circuit comprising:
  a first inductor coupled to the first electrode,
  a first parallel LC circuit in series with the first inductor,
  a second inductor coupled to the second electrode,
  a second parallel LC circuit in series with the second inductor,
  a first sensor between the first inductor and the first parallel LC circuit, the first sensor operable to monitor power of the first electrode, and
  a second sensor between the second inductor and the second parallel LC circuit, the second sensor operable to monitor power of the second electrode.

16. The substrate support assembly of claim 15, wherein the first electrode is disposed below the second electrode, and the second electrode partially overlaps the first electrode.

17. The substrate support assembly of claim 15, wherein the electrode tuning circuit comprises a plurality of capacitors.

18. The substrate support assembly of claim 17, wherein at least one of the plurality of capacitors comprises a variable capacitor.

19. The substrate support assembly of claim 18, wherein the variable capacitor is coupled to the first parallel LC circuit and the second parallel LC circuit.

20. The substrate support assembly of claim 18, wherein the variable capacitor is between ground and at least one of the first parallel LC circuit or the second parallel LC circuit.

21. The substrate support assembly of claim 18, wherein the plurality of capacitors further comprise a fixed capacitor.

22. The substrate support assembly of claim 21, wherein the fixed capacitor is between the variable capacitor and ground.

23. The substrate support assembly of claim 15, wherein the electrode tuning circuit further comprises an intermesh capacitor coupled to the first inductor and the second inductor.

24. The substrate support assembly of claim 15, wherein the second electrode circumferentially surrounds the first electrode.

* * * * *